(12) United States Patent
Kreiner et al.

(10) Patent No.: US 12,087,878 B2
(45) Date of Patent: Sep. 10, 2024

(54) OPTOELECTRONIC SEMICONDUCTOR DEVICE HAVING DIELECTRIC LAYERS, AND METHOD FOR MANUFACTURING THE SAME

(71) Applicant: OSRAM Opto Semiconductors GmbH, Regensburg (DE)

(72) Inventors: Laura Kreiner, Regensburg (DE); Martin Rudolf Behringer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 501 days.

(21) Appl. No.: 17/421,394

(22) PCT Filed: Dec. 19, 2019

(86) PCT No.: PCT/EP2019/086456
§ 371 (c)(1),
(2) Date: Jul. 8, 2021

(87) PCT Pub. No.: WO2020/144047
PCT Pub. Date: Jul. 16, 2020

(65) Prior Publication Data
US 2022/0093826 A1   Mar. 24, 2022

(30) Foreign Application Priority Data

Jan. 11, 2019   (DE) ..................... 10 2019 100 624.4

(51) Int. Cl.
*H01L 33/22*   (2010.01)
*H01L 31/0216*   (2014.01)
*H01L 31/036*   (2006.01)
*H01L 31/18*   (2006.01)
(Continued)

(52) U.S. Cl.
CPC ........ *H01L 33/22* (2013.01); *H01L 31/02161* (2013.01); *H01L 31/036* (2013.01);
(Continued)

(58) Field of Classification Search
CPC ......... H01L 33/22; H01L 33/00; H01L 33/44; H01L 31/02161; H01L 31/1828;
(Continued)

(56) References Cited

U.S. PATENT DOCUMENTS 7,622,746 B1 * 11/2009 Lester ..................... H01L 33/46
257/E33.068
2008/0035944 A1   2/2008 Eberhard et al.
(Continued)

FOREIGN PATENT DOCUMENTS

DE   102008015551 A1   10/2009
DE   102008030751 A1 * 12/2009 ............. H01L 33/22
(Continued)

OTHER PUBLICATIONS

International search report, issued for the corresponding PCT Application No. PCT/EP2019/086456, mailed Mar. 10, 2020, 4 pages (For informational purposes only).
(Continued)

*Primary Examiner* — Walter H Swanson
*Assistant Examiner* — Jacob T Nelson
(74) *Attorney, Agent, or Firm* — VIERING, JENTSCHURA & PARTNER MBB (57) ABSTRACT

An optoelectronic semiconductor device may include a semiconductor body having a first main surface, a first dielectric layer over the first main surface, and a second dielectric layer on a side of the first dielectric layer facing away from the first main surface. The second dielectric layer is patterned to form an ordered photonic structure. The semiconductor body is suitable for emitting or receiving (Continued)

electromagnetic radiation through the first main surface. The first main surface is roughened, and the first dielectric layer is suitable for leveling a roughening of the first main surface.

19 Claims, 6 Drawing Sheets (51) Int. Cl.
*H01L 33/00* (2010.01)
*H01L 33/16* (2010.01)
*H01L 33/44* (2010.01)
*F21S 41/14* (2018.01)
*G03B 21/20* (2006.01)

(52) U.S. Cl.
CPC ...... *H01L 31/1828* (2013.01); *H01L 33/0083* (2013.01); *H01L 33/16* (2013.01); *H01L 33/44* (2013.01); *F21S 41/14* (2018.01); *G03B 21/2006* (2013.01)

(58) Field of Classification Search
CPC ..... H01L 2933/0083; H01L 2933/0091; H01L 2933/0025; H10K 50/00
See application file for complete search history.

(56) References Cited

U.S. PATENT DOCUMENTS

| | | | |
|---|---|---|---|
| 2011/0089446 A1* | 4/2011 | Ku | H01L 33/46 257/98 |
| 2012/0224148 A1 | 9/2012 | Natsumeda et al. | |
| 2012/0261642 A1 | 10/2012 | Bergenek et al. | |
| 2012/0286313 A1* | 11/2012 | Bergenek | H01L 33/50 257/E33.061 |
| 2013/0193450 A1 | 8/2013 | Bergbauer et al. | |
| 2013/0221369 A1 | 8/2013 | Bergbauer et al. | |
| 2015/0380609 A1 | 12/2015 | Lester | |

FOREIGN PATENT DOCUMENTS

| | | |
|---|---|---|
| DE | 102009057780 A1 | 6/2011 |
| DE | 102010020789 A1 | 11/2011 |
| DE | 102010046792 A1 | 3/2012 |
| DE | 102016101442 A1 | 7/2017 |
| EP | 1887634 A2 | 2/2008 |
| EP | 2605296 A2 | 6/2013 |
| KR | 20130074072 A * | 7/2013 |
| WO | 2009010762 A1 | 1/2009 |
| WO | 2011085889 A1 | 7/2011 |
| WO | WO-2012035759 A1 * | 3/2012 ........... G02F 1/1335 |

OTHER PUBLICATIONS

Search report issued for the corresponding German Patent Application No. 10 2019 100 624.4, issued on Oct. 17, 2019, 8 pages (For informational purposes only).

* cited by examiner

OPTOELECTRONIC SEMICONDUCTOR DEVICE HAVING DIELECTRIC LAYERS, AND METHOD FOR MANUFACTURING THE SAME

CROSS-REFERENCE TO RELATED APPLICATIONS

The present application is a national stage entry according to 35 U.S.C. § 371 of PCT Application No. PCT/EP2019/086456 filed on Dec. 19, 2019; which claims priority to German Patent Application Serial No. 10 2019 100 624.4 filed on Jan. 11, 2019; all of which are incorporated herein by reference in their entirety and for all purposes.

TECHNICAL FIELD

An optoelectronic semiconductor device having dielectric layers is specified.

BACKGROUND

A light emitting diode (LED) is a light emitting device based on semiconductor materials. Light-emitting diodes are predominantly Lambertian emitters. That is to say, the emission pattern shows an intensity which depends on a cosine of an angle φ adopted between a surface normal and the radiation direction being considered.

In general, efforts are being made to improve the beam formation of electromagnetic radiation emitted by optoelectronic semiconductor devices.

SUMMARY

An optoelectronic semiconductor device comprises a semiconductor body having a first main surface, a first dielectric layer over the first main surface, and a second dielectric layer on the side of the first dielectric layer facing away from the first main surface. The second dielectric layer is patterned to form an ordered photonic structure. The semiconductor body is suitable for emitting or receiving electromagnetic radiation through the first main surface. The first main surface of the semiconductor body is roughened, and the first dielectric layer is suitable for leveling a roughening of the first main surface.

According to embodiments, the ordered photonic structure comprises horizontally arranged structural elements. That is to say that, according to embodiments, the photonic structure is a horizontal photonic structure.

For example, the second dielectric layer has a greater refractive index than the first dielectric layer. For example, the second dielectric layer has a refractive index greater than 2.

For example, the first dielectric layer contains silicon oxide. The second dielectric layer may contain $Nb_2O_5$.

According to embodiments, holes are patterned in a first main surface of the second dielectric layer. The holes may extend to a bottom side of the second electrical layer. According to further embodiments, an upper part of the second dielectric layer may be patterned. Furthermore, a depth to which the holes extend may be smaller than a layer thickness of the second dielectric layer.

According to embodiments, the ordered photonic structure comprises a photonic crystal. According to further embodiments, the ordered photonic structure may also comprise a photonic quasicrystal. Furthermore, the ordered photonic structure may also comprise deterministic aperiodic structures.

A method for manufacturing an optoelectronic semiconductor device comprises forming a semiconductor body having a first main surface, roughening the first main surface, and forming a first dielectric layer over the first main surface. In this case, a first main surface of the first dielectric layer facing away from the first main surface of the semiconductor body is formed in a planar manner. The method further comprises forming a second dielectric layer on the side of the first dielectric layer facing away from the first main surface, and patterning the second dielectric layer to form an ordered photonic structure. The semiconductor body is suitable for emitting or receiving electromagnetic radiation through the first main surface.

According to embodiments, patterning the second dielectric layer may comprise forming holes in the dielectric layer. For example, the holes extend to a second main surface of the second dielectric layer. According to further embodiments, the holes may extend to a depth which is smaller than the layer thickness of the second dielectric layer.

An optoelectronic apparatus comprises the optoelectronic semiconductor device described above. The optoelectronic apparatus may be selected from a projector, a headlight, or another optical system.

BRIEF DESCRIPTION OF THE DRAWINGS

The accompanying drawings serve to provide an understanding of non-limiting embodiments. The drawings illustrate nonlimiting embodiments and, together with the description, serve for explanation thereof. Further non-limiting embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material or of an insulating material, for example sapphire. Further examples of materials for growth substrates include glass, silicon dioxide, quartz or a ceramic.

Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN and combinations of the materials mentioned. The stoichiometric ratio of the ternary compounds may vary. Other examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical", as used in this description, is intended to describe an orientation which is essentially perpendicular to the first surface of a substrate or semiconductor body. The vertical direction may correspond, for example, to a direction of growth when layers are grown.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of the present disclosure, the term "ordered photonic structure" means a structure the structural elements of which are arranged at predetermined locations. The arrangement pattern of the structural elements is subject to a specific order. The functionality of the ordered photonic structure results from the arrangement of the structural elements. The structural elements are, for example, arranged such that diffraction effects occur. The structural elements may be arranged periodically, for example, so that a photonic crystal is realized. According to further embodiments, the structural elements may be arranged such that they represent deterministic aperiodic structures, for example bird spirals. According to further embodiments, the structural elements may be arranged such that they realize a quasi-periodic crystal, for example an Archimedean lattice.

Figure 1A:
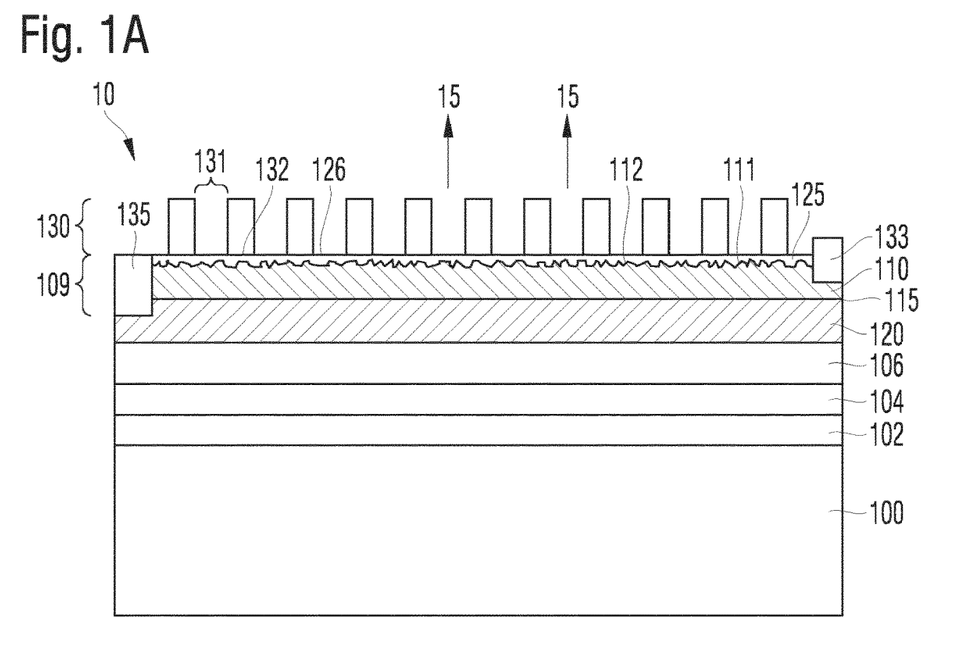
FIG. 1A shows a cross-sectional view of an optoelectronic semiconductor device according to embodiments.

FIG. 1A shows a schematic cross-sectional view of an optoelectronic semiconductor device 10 according to embodiments. The optoelectronic semiconductor device 10 comprises a semiconductor body 109 having a first main surface 111. A first dielectric layer 125 is disposed over the first main surface 111. The optoelectronic semiconductor device 10 furthermore comprises a second dielectric layer 130 on the side of the first dielectric layer 125 facing away from the first main surface 111. The second dielectric layer 130 is patterned to form an ordered photonic structure. The semiconductor body 109 is suitable for emitting or receiving electromagnetic radiation through the first main surface 111. The first main surface 111 is roughened. The first dielectric layer 125 is suitable for leveling the roughening of the first main surface 111.

A layer stack comprising a first dielectric layer 125 and a second dielectric layer 130 is arranged over the first main surface 111 of the semiconductor body 109. The first dielectric layer 125 is configured such that it lines a roughening of the first main surface 111 of the semiconductor body 109 and finally forms a planar surface. The term "roughening of the first main surface" relates to a surface texture of the entire first main surface. The surface texture or roughening may, for example, have a profile depth of 0.1 to 5 µm. Distances between peaks or local maxima of the surface texture may also be in a range from 0.1 to 5 µm. For example, the roughening may be formed randomly and without periodicity. Due to the roughening 112, the coupling efficiency for generated electromagnetic radiation may be increased. The second dielectric layer 130 is arranged over the first dielectric layer 125. According to embodiments, the second dielectric layer 130 is directly adjacent to the first dielectric layer 125. According to further embodiments, one or more additional dielectric layers may be arranged between the first dielectric layer 125 and the second dielectric layer 130. According to embodiments shown in FIG. 1A, the second dielectric layer 130 is patterned to form a photonic crystal.

For example, the structural elements for forming the ordered photonic structure may include holes in the second dielectric layer. It is also possible for the structural elements to comprise protruding portions of the second electrical layer. The structural elements may each be identical. It is also possible for the structural elements to comprise several structural elements that are different from one another. The structural elements may be arranged adjacent to one another in the horizontal direction and thus form a horizontal ordered photonic structure.

According to embodiments, a plurality of identical holes may be formed in the second dielectric layer in order to form the ordered photonic structure. According to the embodiments illustrated in FIG. 1A, the holes are formed and arranged such that a two-dimensional photonic crystal is formed in the second dielectric layer 130. Usually only a radiation fraction may be coupled out via a photonic crystal which fulfills a Bragg condition. The Bragg condition, for example, establishes a relationship between the wavelength of the radiation fraction, the direction of radiation of the radiation fraction and the lattice constant of the photonic crystal. Radiation is usually efficiently coupled out only for those modes of the radiation for which the Bragg condition for the lattice constant of the photonic crystal is met.

For example, by means of photonic crystals or other ordered photonic structures on the emission surface of the optoelectronic semiconductor device, states are created that favor the coupling out of light predominantly in the normal direction, i.e., perpendicular to the first main surface of the semiconductor body. To this end, it is beneficial to select a dielectric material which has a high refractive index. At the same time, the first main surface 111 of the semiconductor body 109 comprises a roughening 112, so that the coupling out of electromagnetic radiation from the semiconductor body 109 is improved. Therefore, the dielectric material should, on the one hand, line the roughening but should, on the other hand, be so smooth that structures in the 100 nm size range may be patterned on the surface.

By using a two-layer system comprising a first and a second dielectric layer, it is now possible to select materials for the dielectric layers that meet these requirements. The material of the first dielectric layer is selected to compensate for the roughening on the surface of the semiconductor body 109. In addition, it is also possible to produce structures in the 100 nm range in the upper surface of the second dielectric layer. When using a two-layer system, the refractive indices of the respective materials may be adapted to the requirements of the device. For example, a refractive index of the second dielectric layer 130 may be selected to be very large. For example, $Nb_2O_5$ may be used as the material for the second dielectric layer 130.

The semiconductor body 109 may, for example, comprise a first semiconductor layer 110 of a first conductivity type, for example p-type, and a second semiconductor layer 120 of a second conductivity type, for example n-type. For example, the first and second semiconductor layers 110, 120 may contain GaN or a GaN-containing compound semiconductor material. In addition to GaN, other semiconductor materials may also be used. An active zone 115 may be arranged between the first semiconductor layer 110 and the second semiconductor layer 120.

The active zone may, for example, comprise a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these structures.

The first semiconductor layer 110 may be electrically controllable via a first contact element 133. Furthermore, the second semiconductor layer 120 may be electrically controllable via a second contact element 135. The second contact element 135 may be configured, for example, such that it is insulated from the first semiconductor layer 110 and from elements electrically connected to the first semiconductor layer 110. For purposes of illustration, FIG. 1A shows a contacting of the semiconductor body 109 from a side of the first main surface 111. It goes without saying, however, that the optoelectronic semiconductor device 10 may comprise additional current spreading layers and other elements through which the respective semiconductor layers 110, 120 may each be electrically connected. When an electrical voltage is applied between the first contact element 133 and the second contact element 135, electromagnetic radiation may be caused to be emitted in the active zone 115.

The semiconductor body 109 may be arranged over a suitable substrate 100. For example, the substrate 100 may be composed of a suitable insulating material, for example glass, ceramic, or a semiconductor material, for example silicon, silicon carbide. According to further embodiments, the substrate 100 may also contain germanium, aluminum nitride (AlN), or aluminum oxide (AlO, $Al_2O_3$) or combinations of these compounds. Furthermore, a bonding layer 102 may be arranged over the substrate 100. The bonding layer 102 may contain, for example, gold-tin, nickel-tin, gold-indium-tin, nickel-indium-tin, gold-gold, similar metallic solder systems and non-conductive connecting materials. The bonding layer 102 serves to mechanically connect the substrate 100 to further components of the optoelectronic semiconductor device. Furthermore, an electrical connection may also be established by means of the bonding layer 102. A metallic mirror layer 104 may be arranged over the bonding layer 102. The metallic mirror layer 104 may, for example, reflect electromagnetic radiation in the direction of the first main surface 111 of the semiconductor body. The metallic mirror layer 104 may contain a metallic material having good reflectivity, for example silver. A dielectric mirror layer 106 may be arranged over the metallic mirror layer 104.

In general, the term "dielectric mirror layer" comprises any arrangement which reflects incident electromagnetic radiation to a large extent (for example>90%) and is non-conductive. For example, a dielectric mirror layer may be formed by a sequence of very thin dielectric layers each of which having a different refractive index. For example, the layers may alternately have a high refractive index (n>1.7) and a low refractive index (n<1.7) and may be formed as a Bragg reflector. For example, the layer thickness may be $\lambda/4$, wherein $\lambda$ indicates the wavelength of the light to be reflected in the respective medium. The layer as viewed from the incident light may have a greater layer thickness, for example $3\lambda/4$. Due to the small layer thickness and the difference in the respective refractive indices, the dielectric mirror layer provides high reflectivity and is non-conductive at the same time. The dielectric mirror layer is thus suitable for isolating components of the semiconductor device from one another. A dielectric mirror layer may, for example, comprise 2 to 50 dielectric layers. A typical layer thickness of the individual layers may be about 30 to 90 nm, for example about 50 nm. The layer stack may furthermore contain one or two or more layers that are thicker than about 180 nm, for example thicker than 200 nm.

According to embodiments, contact holes (not shown) may be formed in the dielectric mirror layer 106 in order to enable an electrical contact to be made between the second semiconductor layer 120 and an associated contact element, if needed. The second semiconductor layer 120 is arranged over the dielectric mirror layer 106.

As shown in FIG. 1A, the second dielectric layer 130 is patterned such that the holes 131 formed in it extend to a second main surface 132 of the second dielectric layer. Correspondingly, the holes 131 extend to a depth which corresponds to the layer thickness of the second dielectric layer 130. For example, the second dielectric layer may have a layer thickness of more than 500 nm.

Figure 1B:
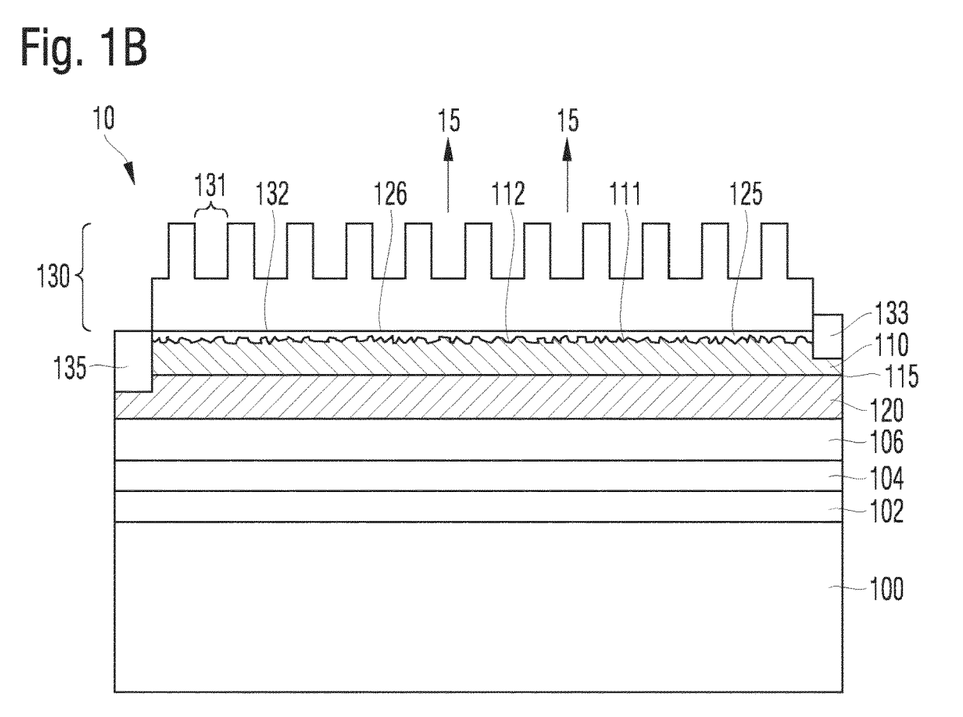
FIG. 1B shows a cross-sectional view of an optoelectronic semiconductor device according to further embodiments.

FIG. 1B shows a cross-sectional view of an optoelectronic semiconductor device in accordance with further embodiments. In FIG. 1B, essentially the same components as in FIG. 1A are illustrated. In contrast to FIG. 1A, however, the second dielectric layer 130 is patterned such that the holes 131 do not extend to the second main surface 132 of the second dielectric layer. Correspondingly, a part of the second dielectric layer 130 is preserved as a continuous layer, and only an upper part of the second dielectric layer 130 is patterned to form a photonic crystal.

Figure 1C:
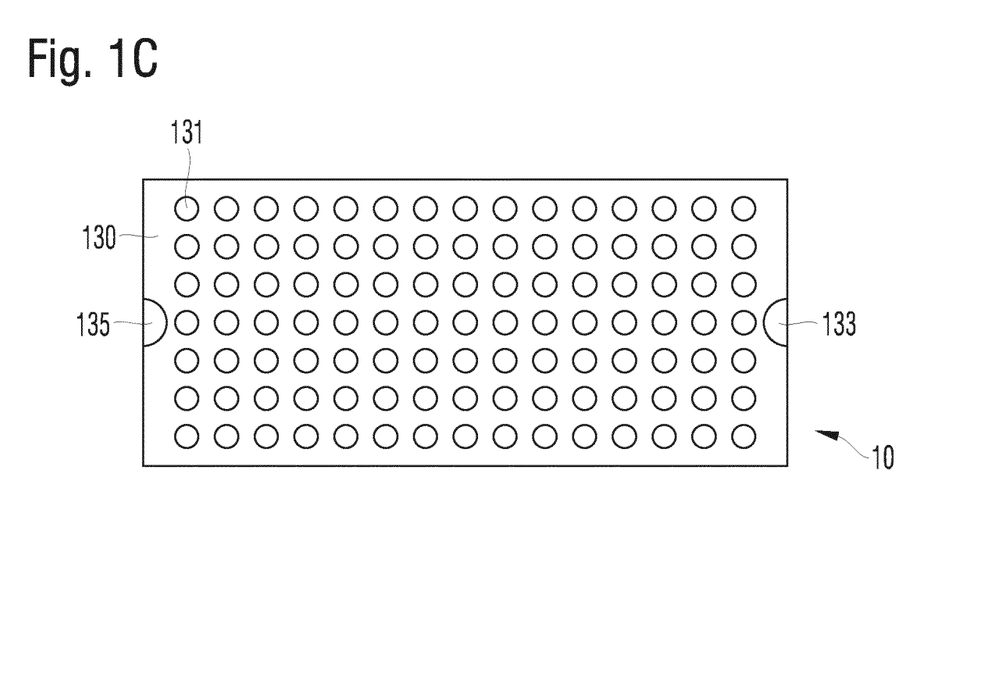
FIGS. 1C and 1D show top views of examples of optoelectronic semiconductor devices.

FIG. 1C shows a top view of an example of an optoelectronic semiconductor device in accordance with embodiments. A plurality of holes 131 is formed in the second dielectric layer 130. The holes 131 are arranged according to a regular pattern. For example, the first contact element 133 and optionally the second contact element 135 may each be formed in an edge region of the optoelectronic semiconductor device 10.

Figure 1D:
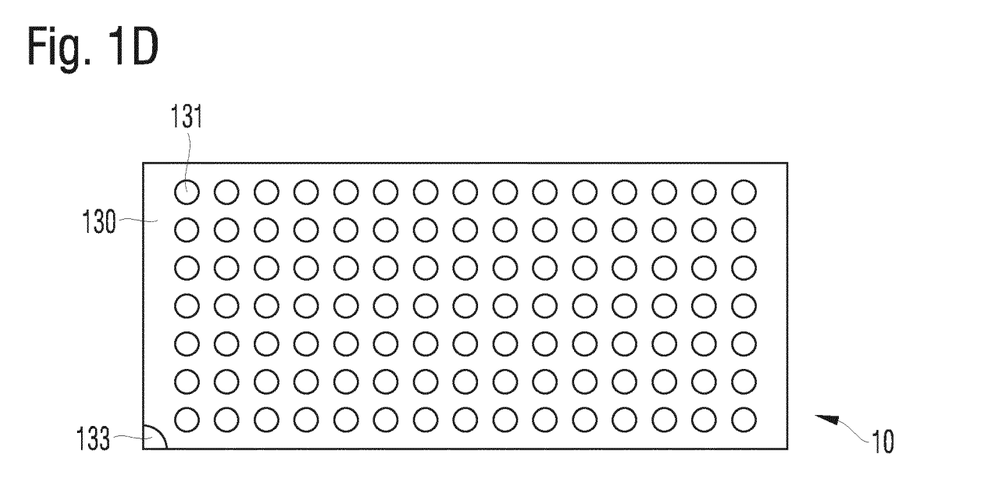

FIG. 1D shows a top view of the optoelectronic semiconductor device 10 according to further embodiments. In FIG. 1D, approximately the same components as in FIG. 1C are illustrated. In contrast, here the first contact element 133 is arranged at a corner of the optoelectronic semiconductor device 10. Furthermore, according to this embodiment, for example, a second contact element 135 for contacting the second semiconductor layer 120 is arranged on the rear side of the optoelectronic semiconductor device.

A method for manufacturing an optoelectronic semiconductor device according to embodiments will be described below with reference to FIGS. 2A to 2D.

Figure 2A:
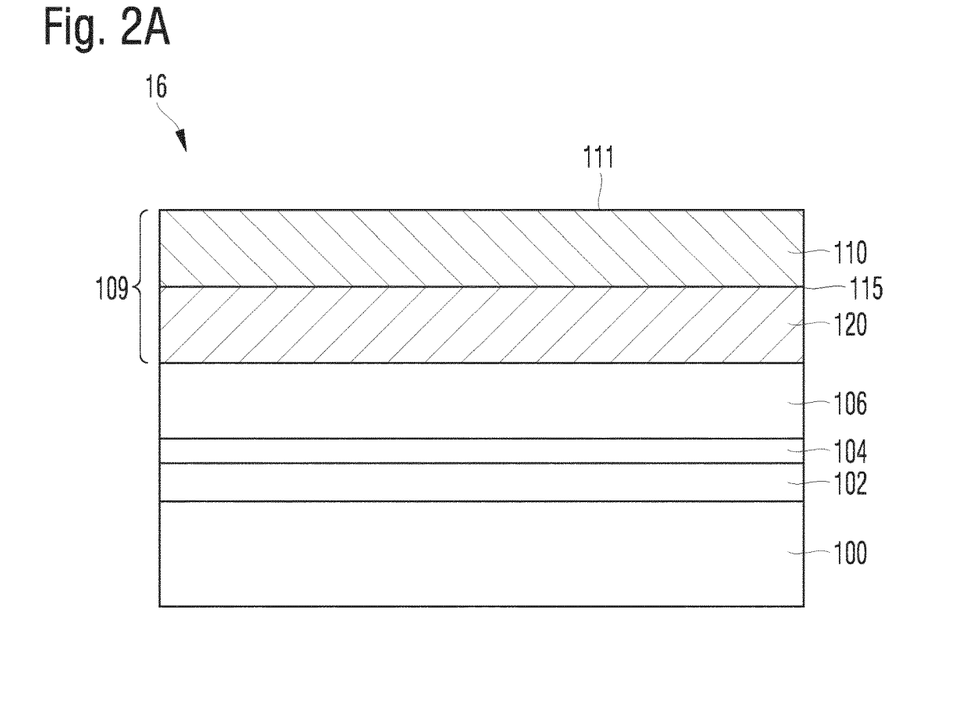
FIGS. 2A to 2D show cross-sectional views of a workpiece in the course of performing a method according to embodiments.

FIG. 2A shows a workpiece 16 in the course of manufacturing the optoelectronic semiconductor device according to embodiments. A semiconductor body 109 is formed. For example, the semiconductor body 109 may comprise a first semiconductor layer 110 of a first conductivity type, a second semiconductor layer 120 of a second conductivity type and an active zone 115. For example, the semiconductor body 109 may be grown epitaxially on a suitable growth substrate (not shown) and may then be further processed, so that finally the sequence of layers shown in FIG. 2A results.

As shown in FIG. 2A, a bonding layer 102, for example, followed by a metallic mirror layer 104 and a dielectric mirror layer 106, is applied over a suitable substrate 100. The semiconductor body 109 is applied to this layer stack in such a manner that the first main surface 111 of the semiconductor body 109 is exposed. The first main surface 111 of the semiconductor body 109 is then roughened. This may be done, for example, by suitable etching processes or by mechanical roughening processes. For example, the first main surface 111 may be etched wet-chemically. If desired, pre-patterning using a suitable mask may be carried out beforehand. According to further embodiments, the first main surface 111 may also be dry-etched in a reactive plasma, for example by using a photo mask.

Figure 2B:
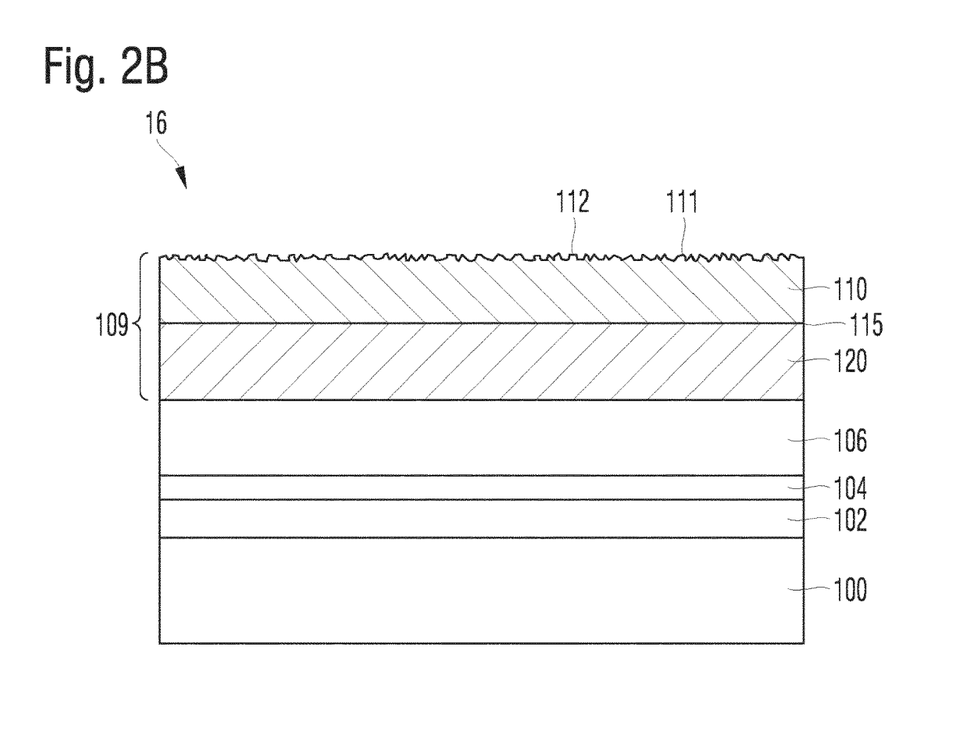

As a result, the workpiece 16 shown in FIG. 2B, for example, is obtained. As may be seen, the first main surface 111 of the semiconductor body 109 is roughened. Consequently, the electromagnetic radiation generated in the active zone 115 may be efficiently coupled out. The structures of the roughening 112 may each have a different size and a randomly selected location.

Figure 2C:
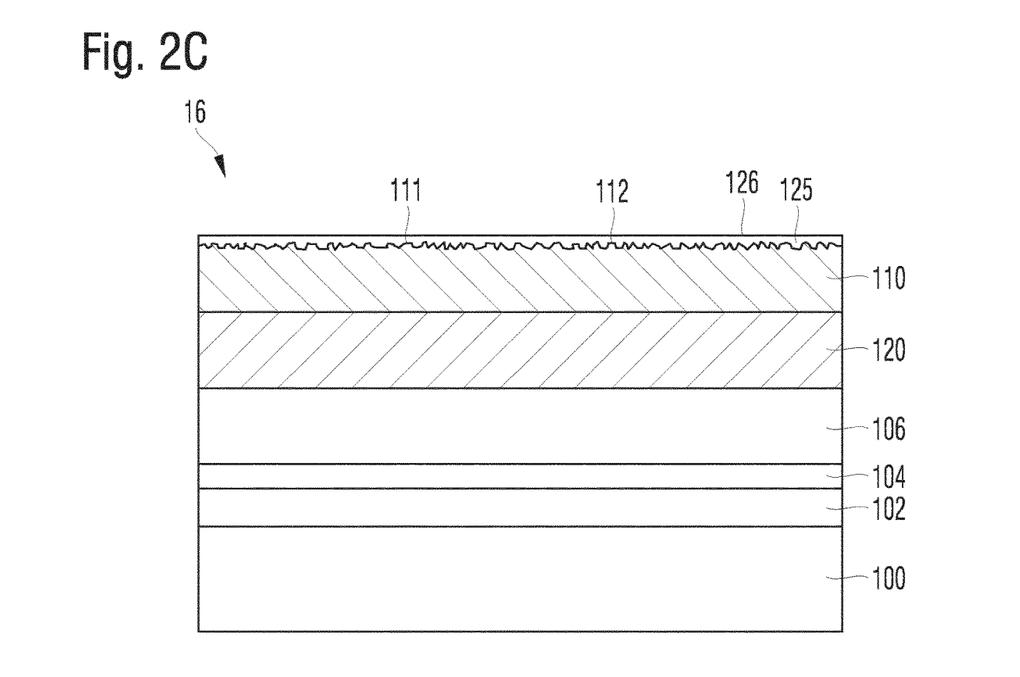

As shown in FIG. 2C, a first dielectric layer 125 is subsequently formed over the first main surface 111. For example, the first dielectric layer 125 may contain silicon oxide. The first dielectric layer 125 may be leveled, for example, by a polishing process, for example a CMP (chemical-mechanical polishing) process, for example to the height of the tips of the roughening 112. As a result, the first main surface 126 of the first dielectric layer 125 is formed to be planar and smooth.

Figure 2D:
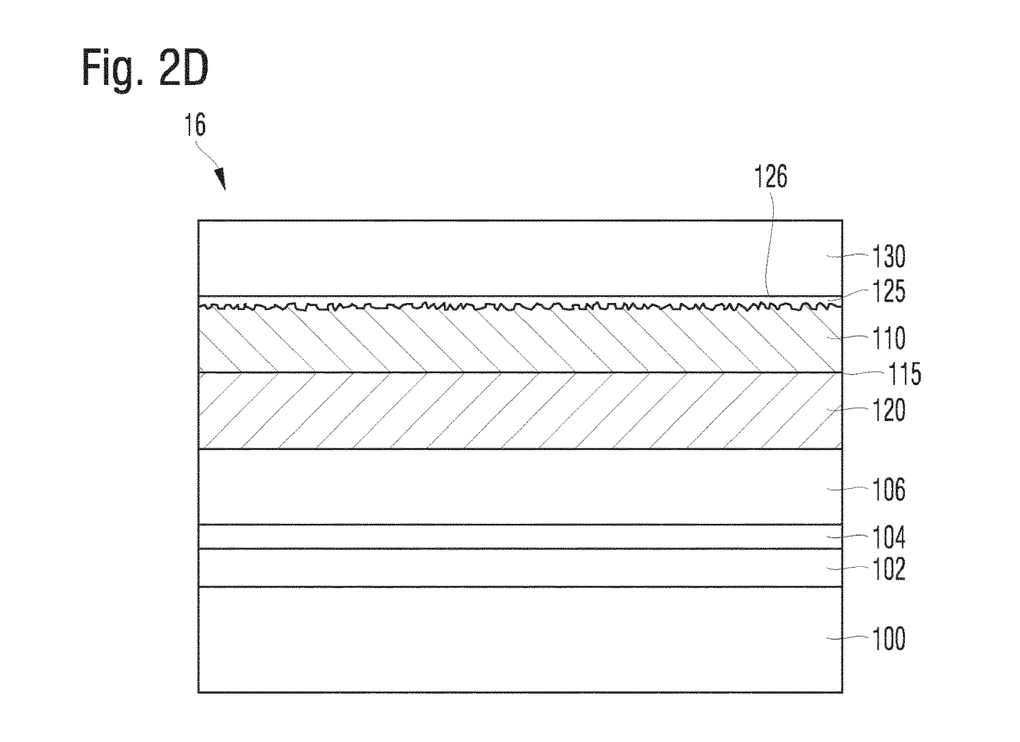

As shown in FIG. 2D, the second dielectric layer 130 may then be applied. The second electrical layer 130 may contain or consist of niobium oxide, for example.

Subsequently, the second dielectric layer 130 is patterned to form an ordered photonic structure.

Figure 3A:
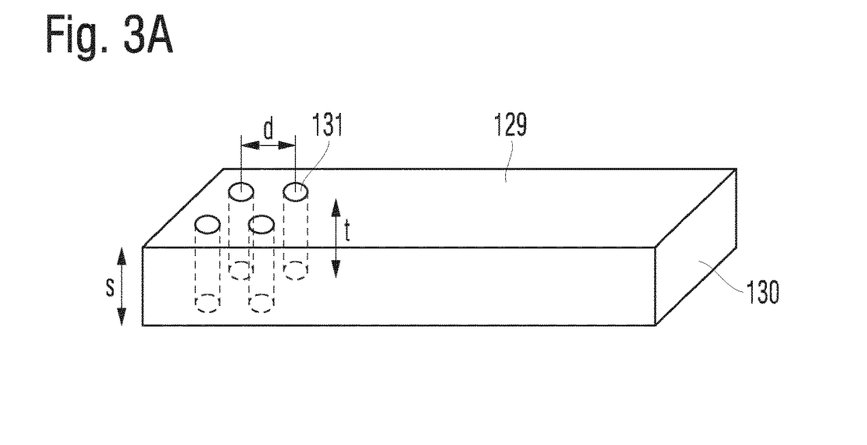
FIG. 3A shows a perspective view of a workpiece according to embodiments.

According to embodiments, as shown in FIG. 3A, holes 131 may be etched into the first main surface 129 of the second dielectric layer 130. The holes have a pitch d of 200 to 500 nm, for example. The pitch is composed of a horizontal extension of the holes and a distance between adjacent holes. An area coverage of the holes is approximately 50% in relation to the horizontal extent of the second dielectric layer 130. As discussed with reference to FIGS. 1A and 1B, the holes 131 may each extend to a depth t, wherein the depth t may correspond, for example, to the layer thickness s of the dielectric layer 130. According to further embodiments, however, the depth t of the holes 131 may be smaller than the layer thickness s of the second dielectric layer 130. In this case, the etching process may be carried out more easily. Furthermore, complete encapsulation of the semiconductor material is ensured. For example, patterning may be performed using an EUV ("Extreme Ultra violet") lithography process. According to further embodiments, a nano-imprint lithography process may also be used for patterning a photoresist material. The second dielectric layer 130 may be etched using the patterned photomask. For example, a plasma etching process may be used to etch the second dielectric layer 130.

By having the ordered photonic structure formed in the second dielectric layer 130, which may contain, for example, niobium oxide or another material of a high refractive index, better coupling out of the electromagnetic radiation and improved formation of modes may be effected. At the same time, the roughening 112 may be leveled by the presence of the first dielectric layer. Due to the presence of the roughening 112 at the interface between the first semiconductor layer 110 and the first dielectric layer 125, the coupling-out efficiency from the semiconductor body 109 may be increased.

Figure 3B:
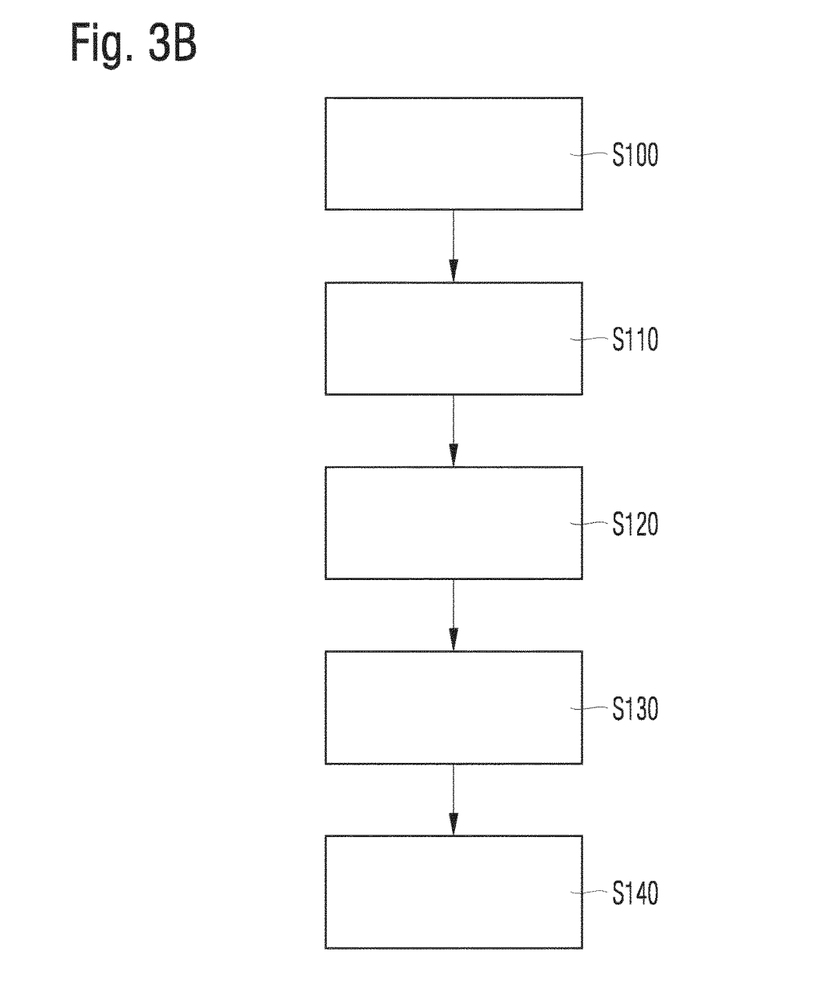
FIG. 3B outlines a method according to embodiments.

FIG. 3B outlines a method according to embodiments. A method for manufacturing an optoelectronic semiconductor device comprises forming (S100) a semiconductor body having a first main surface, roughening (S110) the first main surface, and forming (S120) a first dielectric layer over the first main surface, wherein a first main surface of the first dielectric layer facing away from the first main surface of the semiconductor body is formed to be planar. The method further comprises forming (S130) a second dielectric layer on the side of the first dielectric layer facing away from the first main surface, and patterning (S140) the second dielectric layer to form an ordered photonic structure. The semiconductor body is suitable for emitting or receiving electromagnetic radiation through the first main surface.

Figure 4:
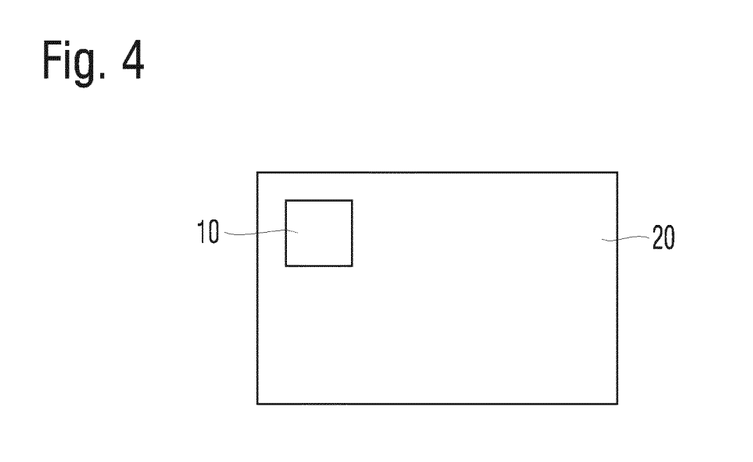
FIG. 4 shows an optoelectronic apparatus according to embodiments.

FIG. 4 shows a schematic view of an optoelectronic apparatus 20 according to embodiments. The optoelectronic apparatus 20 comprises the optoelectronic semiconductor device 10 described herein. For example, the optoelectronic apparatus may be a projector, a headlight, or another optical system.

As has been described, the specific configuration of the dielectric layers enables the emitted electromagnetic radiation to be focused on an intended area and thus to achieve improved beam formation. Correspondingly, a higher directionality of the emitted electromagnetic radiation may be achieved while obtaining a high coupling-out efficiency at the same time.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

LIST OF REFERENCES 10 optoelectronic semiconductor device
15 emitted electromagnetic radiation
16 workpiece
20 optoelectronic apparatus
100 substrate
102 bonding layer
104 metallic mirror layer
106 dielectric mirror layer
109 semiconductor body
110 first semiconductor layer
111 first main surface of the semiconductor body
112 roughening
115 active zone
120 second semiconductor layer
125 first dielectric layer
126 first main surface of the first dielectric layer
129 first main surface of the second dielectric layer
130 second dielectric layer
131 hole
132 second main surface of the second dielectric layer
133 first contact element
135 second contact element

The invention claimed is:

1. An optoelectronic semiconductor device comprising:
a semiconductor body having a first main surface;
a first dielectric layer over the first main surface; and
a second dielectric layer over the first dielectric layer on a side facing away from the first main surface, the second dielectric layer being patterned to form an ordered photonic structure;
wherein:
the semiconductor body is configured to emit or receive electromagnetic radiation through the first main surface;
the first main surface is roughened; and
the first dielectric layer is suitable for leveling a roughening of the first main surface,
wherein the second dielectric layer has a greater refractive index than the first dielectric layer and
the semiconductor body comprises:
a metallic mirror layer;
a dielectric mirror layer over the metallic mirror layer;
a second semiconductor layer over the dielectric mirror layer; and
a first semiconductor layer including the roughened first main surface arranged over the second semiconductor layer.

2. The optoelectronic semiconductor device according to claim 1, wherein the second dielectric layer has a refractive index greater than 2.

3. The optoelectronic semiconductor device according to claim 1, wherein the first dielectric layer contains silicon oxide.

4. The optoelectronic semiconductor device according to claim 1, wherein the second dielectric layer contains $Nb_2O_5$.

5. The optoelectronic semiconductor device according to claim 1, wherein holes are patterned in a first main surface of the second dielectric layer.

6. The optoelectronic semiconductor device according to claim 5, wherein the holes extend to a second main surface of the second dielectric layer.

7. The optoelectronic semiconductor device according to claim 5, wherein a depth of the holes is less than a layer thickness of the second dielectric layer.

8. The optoelectronic semiconductor device according to claim 1, wherein the ordered photonic structure comprises a photonic crystal.

9. The optoelectronic semiconductor device according to claim 1, wherein the ordered photonic structure comprises a photonic quasicrystal.

10. The optoelectronic semiconductor device according to claim 1, wherein the ordered photonic structure comprises deterministic aperiodic structures.

11. An optoelectronic apparatus, comprising the optoelectronic semiconductor device according to claim 1.

12. The optoelectronic apparatus according to claim 11, wherein the optoelectronic apparatus is selected from a projector or a headlight.

13. The optoelectronic semiconductor device according to claim 1, wherein a material of the second dielectric layer is different from the material of the first dielectric layer.

14. A method for manufacturing an optoelectronic semiconductor device, the method comprising:
forming a semiconductor body having a first main surface,
roughening the first main surface,
forming a first dielectric layer over the first main surface, wherein a first main surface of the first dielectric layer facing away from the first main surface of the semiconductor body is formed to be planar,
forming a second dielectric layer over the first dielectric layer facing away from the first main surface, and
patterning the second dielectric layer to form an ordered photonic structure,
wherein the semiconductor body is configured to emit or receive electromagnetic radiation through the first main surface and the second dielectric layer has a greater refractive index than the first dielectric layer and
the semiconductor body comprises:
a metallic mirror layer;
a dielectric mirror layer over the metallic mirror layer;
a second semiconductor layer over the dielectric mirror layer; and
a first semiconductor layer including the roughened first main surface arranged over the second semiconductor layer.

15. The method of claim 14, wherein patterning the second dielectric layer comprises forming holes in the second dielectric layer.

16. The method of claim 15, wherein the holes extend to a second main surface of the second dielectric layer.

17. The method of claim 15, wherein the holes extend to a depth smaller than a layer thickness of the second dielectric layer.

18. The method of claim 14, wherein a material of the second dielectric layer is different from the material of the first dielectric layer.

19. An optoelectronic semiconductor device comprising:
a semiconductor body having a first main surface;
a first dielectric layer over the first main surface; and
a second dielectric layer over the first dielectric layer on a side facing away from the first main surface, the second dielectric layer being patterned to form an ordered photonic structure;
wherein:
the semiconductor body is configured to emit or receive electromagnetic radiation through the first main surface;

the first main surface is roughened; and
the first dielectric layer is suitable for leveling a roughening of the first main surface, wherein
the semiconductor body comprises:
   a metallic mirror layer;
   a dielectric mirror layer over the metallic mirror layer;
   a second semiconductor layer over the dielectric mirror layer; and
   a first semiconductor layer including the roughened first main surface arranged over the second semiconductor layer.

* * * * *